United States Patent
Peterson et al.

(10) Patent No.: US 10,097,150 B1
(45) Date of Patent: Oct. 9, 2018

(54) SYSTEMS AND METHODS TO INCREASE VOLUME OF AUDIO OUTPUT BY A DEVICE

(71) Applicant: Lenovo (Singapore) Pte. Ltd., New Tech Park (SG)

(72) Inventors: Nathan J. Peterson, Oxford, NC (US); Gary David Cudak, Wake Forest, NC (US); Jennifer Lee-Baron, Morrisville, NC (US); Amy Leigh Rose, Chapel Hill, NC (US); John Scott Crowe, Durham, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/648,781

(22) Filed: Jul. 13, 2017

(51) Int. Cl.
*H03G 3/32* (2006.01)
*H04S 7/00* (2006.01)
*G06F 3/16* (2006.01)

(52) U.S. Cl.
CPC ............... *H03G 3/32* (2013.01); *G06F 3/165* (2013.01); *H04S 7/303* (2013.01); *H04R 2430/01* (2013.01)

(58) Field of Classification Search
CPC .. H03G 3/32; H03G 1/02; G06F 3/165; H04S 7/303; H04R 2430/01; H04B 1/202
USPC ......... 381/56, 57, 58, 91, 95, 102, 104, 105, 381/107
See application file for complete search history.

(56) References Cited

U.S. PATENT DOCUMENTS

| | | | | |
|---|---|---|---|---|
| 2008/0240461 A1* | 10/2008 | Nakamura | ............. | H04R 5/023 381/81 |
| 2009/0304205 A1* | 12/2009 | Hardacker | ............. | H03G 3/301 381/104 |
| 2011/0091055 A1* | 4/2011 | LeBlanc | ................. | H04S 7/301 381/303 |
| 2013/0024018 A1* | 1/2013 | Chang | .................... | G08C 17/02 700/94 |
| 2013/0289983 A1* | 10/2013 | Park | ........................ | G10L 15/26 704/235 |
| 2015/0222977 A1* | 8/2015 | Angel, Jr. | ............... | H04R 1/105 381/74 |
| 2015/0334079 A1* | 11/2015 | Laidlaw | .................. | H04L 51/38 340/539.11 |
| 2016/0286313 A1* | 9/2016 | Kofman | .................... | H04R 3/12 |
| 2017/0287321 A1* | 10/2017 | Ann | ........................ | G08C 17/02 |

* cited by examiner

*Primary Examiner* — William A Jerez Lora
(74) *Attorney, Agent, or Firm* — John L. Rogitz; John M. Rogitz

(57) ABSTRACT

In one aspect, a first device includes at least one processor, a microphone accessible to the at least one processor, and storage accessible to the at least one processor. The storage bears instructions executable by the at least one processor to receive input from the microphone and determine, based on the input from the microphone, whether sound from a second device meets a sound criterion. The instructions are also executable by the at least one processor to, responsive to the determination, issue a command to increase the volume of audio output by a third device.

23 Claims, 7 Drawing Sheets

SYSTEMS AND METHODS TO INCREASE VOLUME OF AUDIO OUTPUT BY A DEVICE

BACKGROUND

When a user listens to audio such as a song or audio from a television show, naturally the user would like to clearly hear the audio that is presented. However, as recognized herein, either a user may move to a more-distant location relative to the device that is presenting the audio but still wish to hear the audio even at the more-distance location, or a user's ability to hear the audio may be impeded by sound generated by another device. There are currently no adequate solutions to the foregoing computer-related, technological problem.

SUMMARY

Accordingly, in one aspect a first device includes at least one processor, a microphone accessible to the at least one processor, and storage accessible to the at least one processor. The storage bears instructions executable by the at least one processor to receive input from the microphone and determine, based on the input from the microphone, whether sound from a second device meets a sound criterion. The instructions are also executable by the at least one processor to, responsive to the determination, issue a command to increase the volume of audio output by a third device.

In another aspect, a method includes receiving, at a first device, input from a microphone. The method also includes determining, based on the input from the microphone, whether sound from a second device meets a sound criterion. Still further, the method includes transmitting, responsive to the determining, a command to a third device to increase the volume of audio output by the third device.

In still another aspect, an apparatus includes a first processor, a network adapter, and storage bearing instructions. The instructions are executable by a second processor of a first device for receiving input from a microphone accessible to the at least one second processor and determining, based on the input from the microphone, whether sound from a second device meets a sound criterion. The instructions are also executable by the second processor for providing, responsive to the determining, a command to increase the volume of audio output by a third device. The first processor transfers the instructions to the first device over a network via the network adapter.

In yet another aspect, a first device includes at least one processor, a microphone accessible to the at least one processor, and storage accessible to the at least one processor. The storage bears instructions executable by the at least one processor to receive input from the microphone and determine, based on the input from the microphone, whether sound from a second device meets a sound criterion. The instructions are also executable by the at least one processor to, responsive to the determination, issue a command to alter the volume of audio output by a third device.

The details of present principles, both as to their structure and operation, can best be understood in reference to the accompanying drawings, in which like reference numerals refer to like parts, and in which:

DETAILED DESCRIPTION

Figure 1:
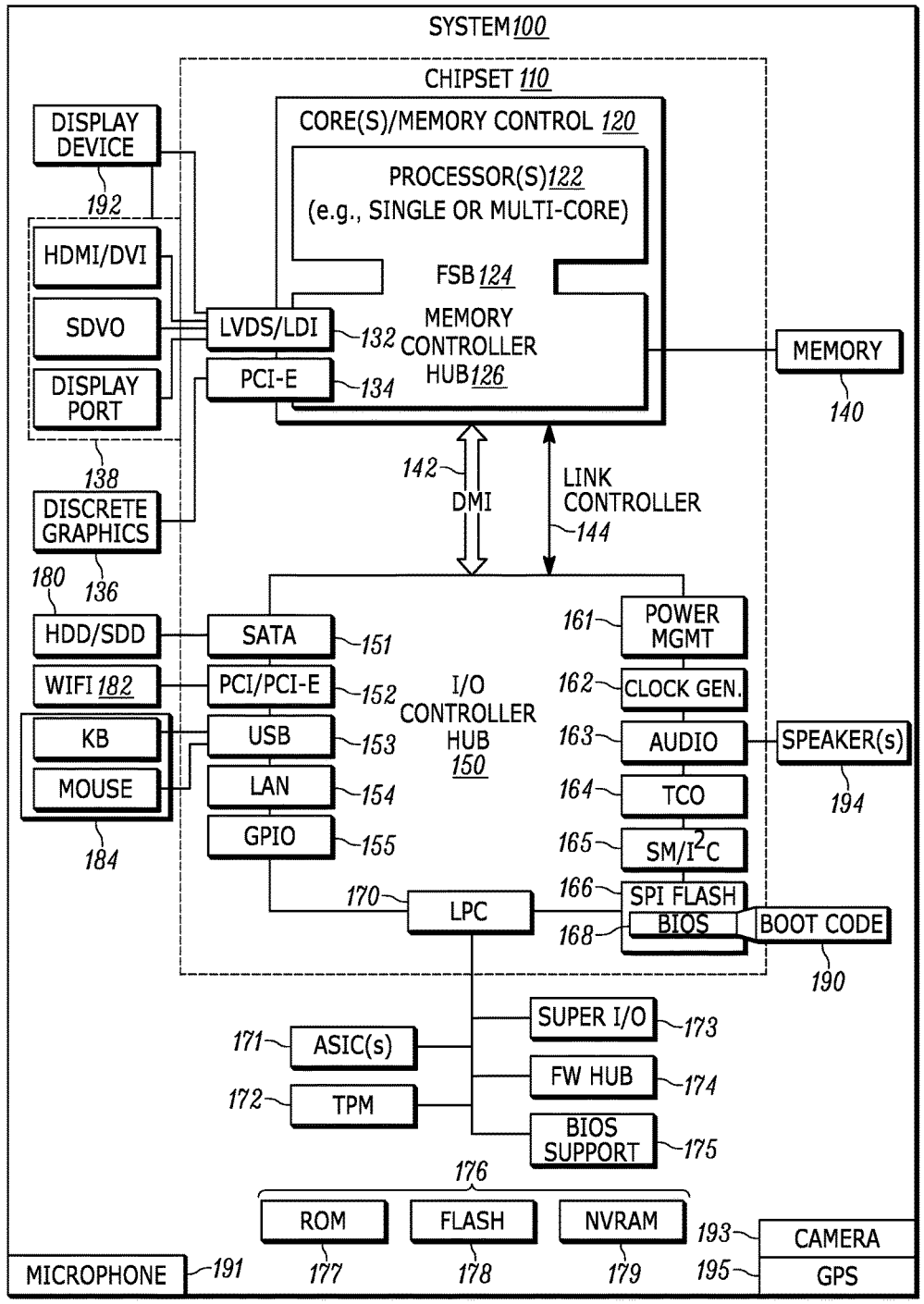
FIG. 1 is a block diagram of an example system in accordance with present principles.

In accordance with present principles, a user's personal device such as a wearable device or smart phone may help coordinate sound output across multiple other devices. For example, when a user is listening to audio from a first device while wearing a smart watch having its own microphone, the user can set an optimal volume for that audio output by the first device. Then, if the user moves around, the volume of audio output by the first device may be increased or decreased based on the user's changing distance (as determined by the wearable device) so that the volume appears to the user to be at the optimal volume level at different locations to which the user moves.

If sound from multiple devices can be heard by the user's wearable device, the wearable device can decide, or the user can tell it, which device the user is focused on. Based on this, the wearable device can turn up the volume of one device being focused on and/or turn down the volume of the other device.

If multiple people are using their respective personal devices to listen to different audio outputs within the same environment at the same time, a handshaking or precedent/priority may be established for which audio to increase the volume and which audio to decrease the volume.

As an example, if a user left on an audio device in the user's kitchen and walked over to the user's den and turned on the TV in the den, when the user sits down in the den the wearable device may automatically decrease the volume of the kitchen device and/or increase the volume of the TV.

As another example, if a father or mother were watching TV and their child's separate device was also outputting audio, the father/mother's wearable device may reduce the volume of the audio output by the child's device based on the father/mother having a higher-ranked user priority.

As yet another example, a noisy appliance may be paused when a user is listening to music or watching TV. Or, if the TV is already on and someone else starts a noisy dishwasher cycle, a device in accordance with present principles may command the dishwasher to delay starting the cycle until the TV is turned off.

With respect to any computer systems discussed herein, a system may include server and client components, connected over a network such that data may be exchanged between the client and server components. The client components may include one or more computing devices including televisions (e.g., smart TVs, Internet-enabled TVs), computers such as desktops, laptops and tablet computers, so-called convertible devices (e.g., having a tablet configuration and laptop configuration), and other mobile devices including smart phones. These client devices may employ, as non-limiting examples, operating systems from Apple, Google, or Microsoft. A Unix or similar such as Linux operating system may be used. These operating systems can execute one or more browsers such as a browser made by Microsoft or Google or Mozilla or another browser program that can access web pages and applications hosted by Internet servers over a network such as the Internet, a local intranet, or a virtual private network.

As used herein, instructions refer to computer-implemented steps for processing information in the system. Instructions can be implemented in software, firmware or hardware, or combinations thereof and include any type of programmed step undertaken by components of the system; hence, illustrative components, blocks, modules, circuits, and steps are sometimes set forth in terms of their functionality.

A processor may be any conventional general-purpose single- or multi-chip processor that can execute logic by means of various lines such as address lines, data lines, and control lines and registers and shift registers. Moreover, any logical blocks, modules, and circuits described herein can be implemented or performed with a general-purpose processor, a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can be implemented by a controller or state machine or a combination of computing devices.

Software modules and/or applications described by way of flow charts and/or user interfaces herein can include various sub-routines, procedures, etc. Without limiting the disclosure, logic stated to be executed by a particular module can be redistributed to other software modules and/or combined together in a single module and/ or made available in a shareable library.

Logic when implemented in software, can be written in an appropriate language such as but not limited to C# or C++, and can be stored on or transmitted through a computer-readable storage medium (that is not a transitory, propagating signal per se) such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc.

In an example, a processor can access information over its input lines from data storage, such as the computer readable storage medium, and/or the processor can access information wirelessly from an Internet server by activating a wireless transceiver to send and receive data. Data typically is converted from analog signals to digital by circuitry between the antenna and the registers of the processor when being received and from digital to analog when being transmitted. The processor then processes the data through its shift registers to output calculated data on output lines, for presentation of the calculated data on the device.

Components included in one embodiment can be used in other embodiments in any appropriate combination. For example, any of the various components described herein and/or depicted in the Figures may be combined, interchanged or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together, etc.

The term "circuit" or "circuitry" may be used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions.

Now specifically in reference to FIG. 1, an example block diagram of an information handling system and/or computer system 100 is shown that is understood to have a housing for the components described below. Note that in some embodiments the system 100 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a client device, a server or other machine in accordance with present principles may include other features or only some of the features of the system 100. Also, the system 100 may be, e.g., a game console such as XBOX®, and/or the system 100 may include a wireless telephone, notebook computer, and/or other portable computerized device.

As shown in FIG. 1, the system 100 may include a so-called chipset 110. A chipset refers to a group of integrated circuits, or chips, that are designed to work together. Chipsets are usually marketed as a single product (e.g., consider chipsets marketed under the brands INTEL®, AMD®, etc.).

In the example of FIG. 1, the chipset 110 has a particular architecture, which may vary to some extent depending on brand or manufacturer. The architecture of the chipset 110 includes a core and memory control group 120 and an I/O controller hub 150 that exchange information (e.g., data, signals, commands, etc.) via, for example, a direct management interface or direct media interface (DMI) 142 or a link controller 144. In the example of FIG. 1, the DMI 142 is a chip-to-chip interface (sometimes referred to as being a link between a "northbridge" and a "southbridge").

The core and memory control group 120 include one or more processors 122 (e.g., single core or multi-core, etc.) and a memory controller hub 126 that exchange information via a front side bus (FSB) 124. As described herein, various components of the core and memory control group 120 may be integrated onto a single processor die, for example, to make a chip that supplants the conventional "northbridge" style architecture.

The memory controller hub 126 interfaces with memory 140. For example, the memory controller hub 126 may provide support for DDR SDRAM memory (e.g., DDR, DDR2, DDR3, etc.). In general, the memory 140 is a type of random-access memory (RAM). It is often referred to as "system memory."

The memory controller hub 126 can further include a low-voltage differential signaling interface (LVDS) 132. The LVDS 132 may be a so-called LVDS Display Interface (LDI) for support of a display device 192 (e.g., a CRT, a flat panel, a projector, a touch-enabled display, etc.). A block 138 includes some examples of technologies that may be supported via the LVDS interface 132 (e.g., serial digital video, HDMI/DVI, display port). The memory controller hub 126 also includes one or more PCI-express interfaces (PCI-E) 134, for example, for support of discrete graphics 136. Discrete graphics using a PCI-E interface has become an alternative approach to an accelerated graphics port (AGP). For example, the memory controller hub 126 may include a 16-lane (x16) PCI-E port for an external PCI-E-based graphics card (including, e.g., one of more GPUs). An example system may include AGP or PCI-E for support of graphics.

In examples in which it is used, the I/O hub controller 150 can include a variety of interfaces. The example of FIG. 1 includes a SATA interface 151, one or more PCI-E interfaces 152 (optionally one or more legacy PCI interfaces), one or more USB interfaces 153, a LAN interface 154 (more generally a network interface for communication over at least one network such as the Internet, a WAN, a LAN, etc. under direction of the processor(s) 122), a general purpose I/O interface (GPIO) 155, a low-pin count (LPC) interface 170, a power management interface 161, a clock generator interface 162, an audio interface 163 (e.g., for speakers 194 to output audio), a total cost of operation (TCO) interface 164, a system management bus interface (e.g., a multi-master serial computer bus interface) 165, and a serial peripheral flash memory/controller interface (SPI Flash) 166, which, in the example of FIG. 1, includes BIOS 168 and boot code 190. With respect to network connections, the I/O hub controller 150 may include integrated gigabit Ethernet controller lines multiplexed with a PCI-E interface port. Other network features may operate independent of a PCI-E interface.

The interfaces of the I/O hub controller 150 may provide for communication with various devices, networks, etc. For example, where used, the SATA interface 151 provides for reading, writing or reading and writing information on one or more drives 180 such as HDDs, SDDs or a combination thereof, but in any case, the drives 180 are understood to be, e.g., tangible computer readable storage mediums that are not transitory, propagating signals. The I/O hub controller 150 may also include an advanced host controller interface (AHCI) to support one or more drives 180. The PCI-E interface 152 allows for wireless connections 182 to devices, networks, etc. The USB interface 153 provides for input devices 184 such as keyboards (KB), mice and various other devices (e.g., cameras, phones, storage, media players, etc.).

In the example of FIG. 1, the LPC interface 170 provides for use of one or more ASICs 171, a trusted platform module (TPM) 172, a super I/O 173, a firmware hub 174, BIOS support 175 as well as various types of memory 176 such as ROM 177, Flash 178, and non-volatile RAM (NVRAIVI) 179. With respect to the TPM 172, this module may be in the form of a chip that can be used to authenticate software and hardware devices. For example, a TPM may be capable of performing platform authentication and may be used to verify that a system seeking access is the expected system.

The system 100, upon power on, may be configured to execute boot code 190 for the BIOS 168, as stored within the SPI Flash 166, and thereafter processes data under the control of one or more operating systems and application software (e.g., stored in system memory 140). An operating system may be stored in any of a variety of locations and accessed, for example, according to instructions of the BIOS 168.

Additionally, the system 100 may include an audio receiver/microphone 191 that provides input from the microphone to the processor 122 based on audio/sound that is detected in accordance with present principles. In some embodiments, the microphone 191 may actually be an array of plural microphones. The microphones in the array may be e.g. fiber optic microphones, pressure-gradient microphones, uni-directional microphones, cardioid microphones and/or so-called "shotgun" microphones, etc.

The system 100 may also include a camera 193 that gathers one or more images and provides input related thereto to the processor 122. The camera may be a thermal imaging camera, a digital camera such as a webcam, a three-dimensional (3D) camera, and/or a camera otherwise integrated into the system 100 and controllable by the processor 122 to gather pictures/images and/or video. Still further, the system 100 may include a GPS transceiver 195 that is configured to communicate with at least one satellite to receive/identify geographic position information and provide the geographic position information to the processor 122. However, it is to be understood that another suitable position receiver other than a GPS receiver may be used in accordance with present principles to determine the location of the system 100.

Though not shown for clarity, in some embodiments the system 100 may also include a gyroscope that senses and/or measures the orientation of the system 100 and provides input related thereto to the processor 122, as well as an accelerometer that senses acceleration and/or movement of the system 100 and provides input related thereto to the processor 122.

It is to be understood that an example client device or other machine/computer may include fewer or more features than shown on the system 100 of FIG. 1. In any case, it is to be understood at least based on the foregoing that the system 100 is configured to undertake present principles.

Figure 2:
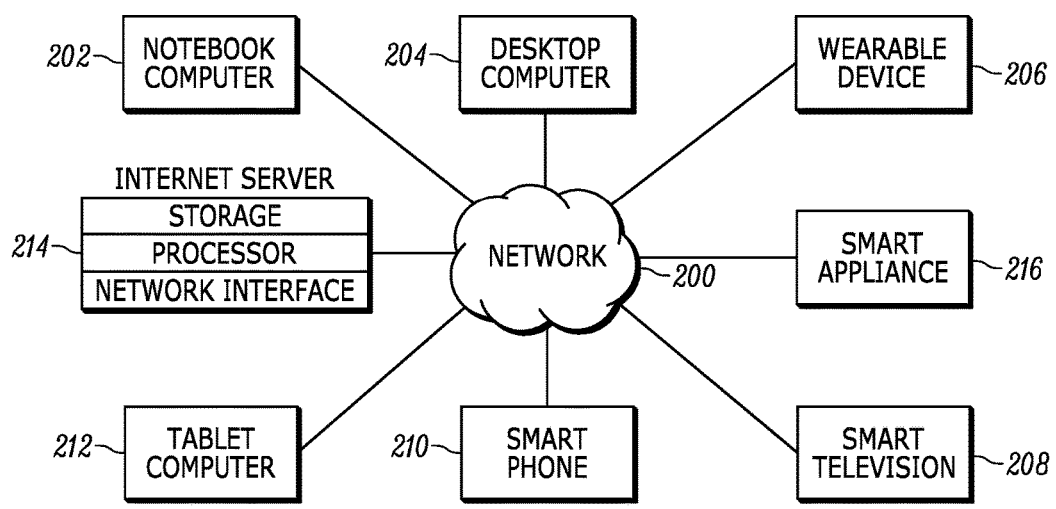
FIG. 2 is a block diagram of an example network of devices in accordance with present principles.

Turning now to FIG. 2, example devices are shown communicating over a network 200 such as the Internet or a Bluetooth network in accordance with present principles. In some embodiments, the network 200 may specifically be an Internet of things network. It is to be understood that each of the devices described in reference to FIG. 2 may include at least some of the features, components, and/or elements of the system 100 described above. Indeed, any of the devices disclosed herein may include at least some of the features, components, and/or elements of the system 100 described above.

FIG. 2 shows a notebook computer and/or convertible computer 202, a desktop computer 204, a wearable device 206 such as a smart watch, a smart television (TV) 208, a smart phone 210, a tablet computer 212, a smart appliance 216, and a server 214 such as an Internet server that may provide cloud storage accessible to the devices 202-212, 216. Describing the smart appliance 216 in more detail, it may be a smart oven/stove, a smart dishwasher, a smart microwave, a smart fan, a smart blender, etc. It is to be understood that the devices 202-216 are configured to communicate with each other over the network 200 to undertake present principles.

Figure 3:
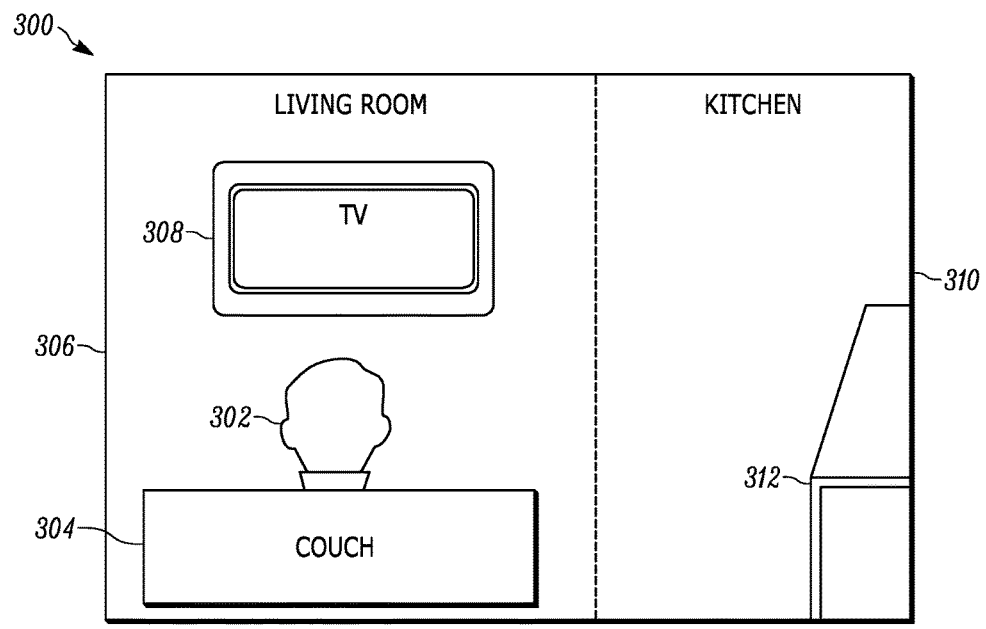
FIGS. 3-5 show example illustrations in accordance with present principles.
Figure 4:
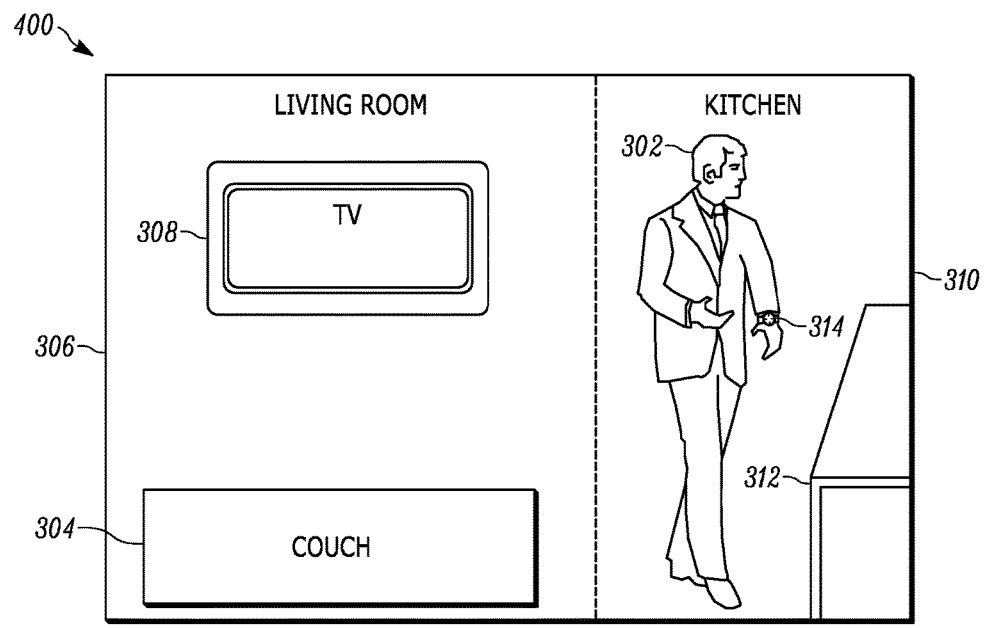

Now describing FIGS. 3 and 4, they respectively show example illustrations 300, 400 in accordance with present principles. In both of the illustrations 300, 400, a user 302 is shown. In the illustration 300, the user 302 is shown sitting on a couch 304 in a living room 306 of a personal residence while watching audio video content presented via a smart television 308. In the illustration 400, the user 302 has moved from the living room 306 to an adjacent kitchen 310 (next to a table 312), with the user 302 understood to be farther away from the TV 308 in the kitchen 310 than when on the couch 304.

In both of FIGS. 3 and 4, the user 302 is understood to be wearing a smart watch 314, though it is only shown in FIG. 4. In accordance with present principles, a microphone on the smart watch 314 may sense audio output by the TV 308 through the TV's speakers as part of the audio video content that the TV 308 is presenting. When the user 302 is on the couch 304 in front of the TV 308 as shown in FIG. 3, the smart watch 314 may sense the volume level of the audio at the location of the smart watch 314 and hence at the location of the user 302. The smart watch 314 may then communicate with the TV 308 to provide a command to the TV 308 (e.g., via the Internet, a Bluetooth network, or a local area network (LAN)) to adjust the volume output by the TV 308 so that, at the location of the user 302 on the couch 304, the audio is at a predefined volume level (e.g., in decibels).

Then, when the user 302 is in the relatively more-distant kitchen 310 relative to the TV 308 as shown in FIG. 4, the smart watch 314 may again sense the volume level of the audio at the location of the smart watch 314 and hence at the location of the user 302 (in this case, the location of the user 302 as he/she stands in the kitchen 310) and communicate with the TV 308 to provide a command to increase the volume output by the TV 308 so that, at the location of the user 302 in the kitchen 310, the audio remains at the same predefined volume level. Thus, as the user moves back and forth from the living room 306 to the kitchen and to other places within the personal residence, volume of the audio that is output from the TV 308 may be increased proportionally as the distance from the TV 308 (the source of the audio) to the user 302 increases, and decreased proportionally as the distance from the TV 308 to the user 302 decreases. Accordingly, the volume of the audio that is output by the TV 308 may appear the same to the user 302 despite the user 302 moving closer to or farther away from the TV 308.

Figure 5:
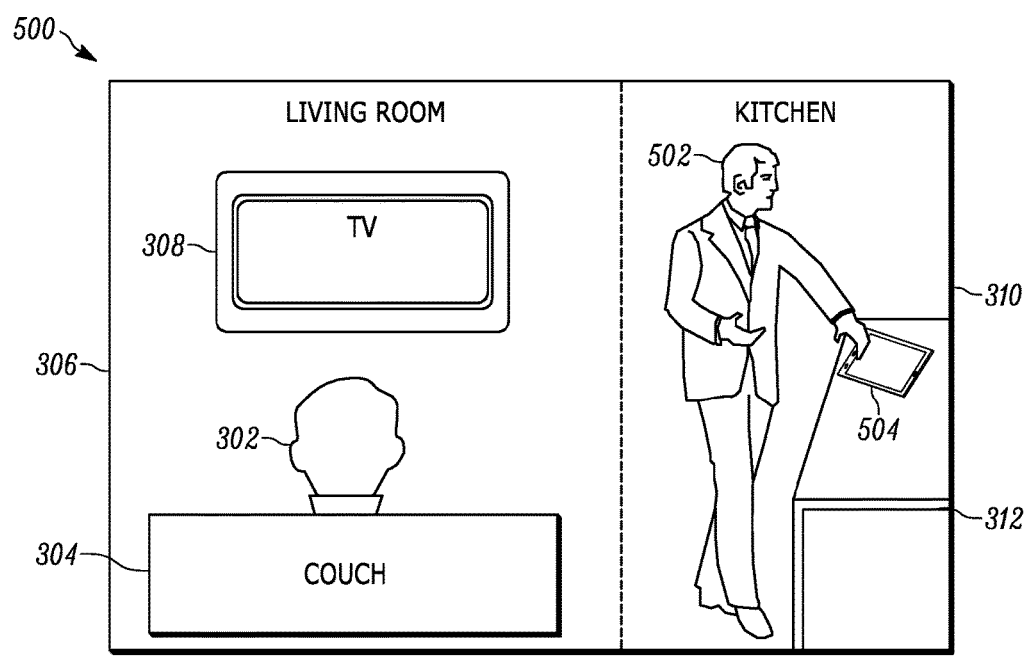

FIG. 5 shows another illustration 500 in accordance with present principles. The user 302 is again shown sitting on the couch 304 in the living room 306 while watching audio video content presented on the TV 308. However, in the illustration 500 a second user 502 is also present within the personal residence, and specifically in the kitchen 310. The second user 502 is operating a tablet computer 504 sitting atop the table 312. The tablet computer 504 is also understood to be presenting audio video content via its own speakers and display.

However, this different audio video content as presented via the tablet computer 504 is now interfering with the ability of the user 302 to clearly hear and enjoy audio that is output by the TV 308 since the user 302 can now also hear the audio from the tablet computer 504 in the adjoining kitchen 310. The microphone on the smart watch 314 still being worn by the user (but not shown in FIG. 5 for simplicity) may sense the audio from the tablet computer 504 and based on that the smart watch 314 may take a corresponding action.

For example, the smart watch 314 may transmit a command to the tablet computer 504 to decrease the volume of the audio output by the tablet computer 504. Additionally, or alternatively, the smart watch 314 may transmit a command to the TV 308 to increase the volume of the audio output by the TV 308 so that the user can hear the audio output by the TV 308 over the audio being output by the tablet computer 504. The smart watch 314 may do one or both of those things based on the audio from the TV 308 no longer being intelligible to the smart watch 314 owing to the additional audio in the personal residence from the tablet computer 504. The smart watch 314 may also do one or both of those things based on the audio from the tablet computer 504 being above a threshold decibel level at the location of the user 302 as sensed by the smart watch 314 at the location of the user 302.

Then, once the TV 308 stops presenting the audio video content it has been presenting, such as if the device is muted or turned off, the smart watch 314 may transmit another command to the tablet computer 504. This other command may be a command for the tablet computer 314 to resume outputting audio at the same level it was previously outputting its audio at before the smart watch 314 commanded that it be decreased.

Figure 6:
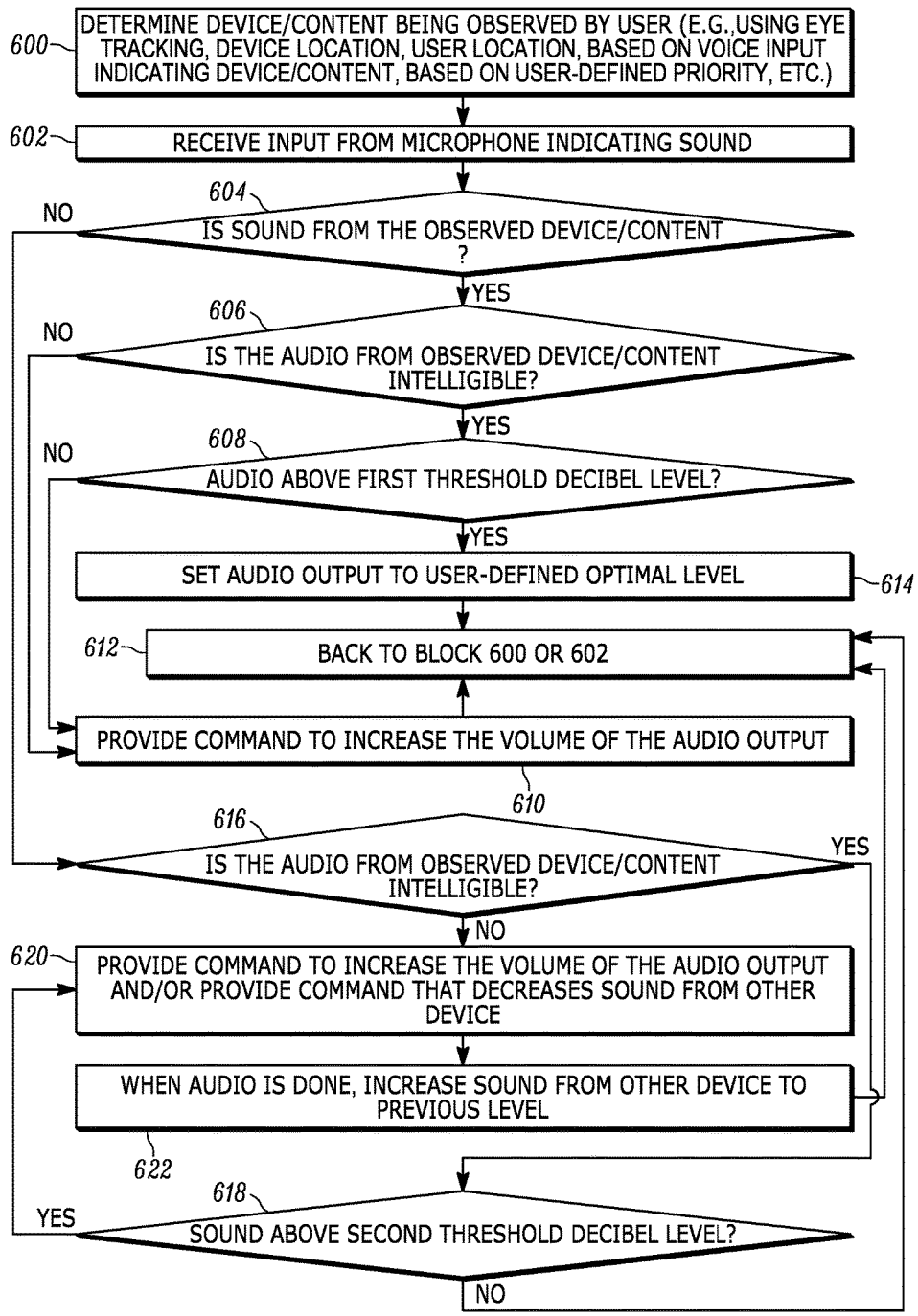
FIG. 6 is a flow chart of an example algorithm in accordance with present principles.

Referring now to FIG. 6, it shows example logic that may be executed by a device such as the system 100, the smart watch 314, or another device in accordance with present principles. The device executing the logic of FIG. 6 will be referred to below as the "first device".

Beginning at block 600, the first device may determine another device and/or particular content that is being observed/focused on by a user. This may be done, for example, by receiving images from a camera within an environment in which the user is disposed (such as a camera on a TV the user is viewing) and executing eye tracking software to, using the images, identify a particular device at which a user is looking. This may also be done by tracking a user's location and/or a location of the user's personal device (such as their smart watch or smart phone, or the first device of FIG. 6 in the present example) and determining a most-proximate device that is currently presenting content relative to the location of the user/device. Voice and other user input (e.g., touch input to a display) may also be used, such as a user instructing the first device to "focus on" another device that is currently presenting audio video content so that the volume of audio from that other device/content may be adjusted so that a user can continue to hear the audio, as set forth further below.

Additionally, a user-defined priority for which device to focus on may also be used to determine which device/content is being observed by a user. For instance, a device may set a priority for all devices that might be currently presenting audio so that a higher-ranked device is selected first before a lower ranked device so that volume adjustments may be made such that the user can hear audio from the higher-ranked device over sound from the lower-ranked device. The user may define this priority by providing input to a user interface (UI) presented on a display for establishing the priority.

From block 600 the logic of FIG. 6 may then move on to block 602. At block 602 the first device may receive input from a microphone on the first device that indicates sound. The logic may then continue on to decision diamond 604, where the first device may determine whether the sound indicated in the input from the microphone is from or otherwise associated with the content/device determined to be observed by the user. The determination at diamond 604 may be made, for example, if sound from only one device appears to be indicated in the input with no other devices currently emanating sound, as may be determined based on the input from the microphone and/or communication with other devices communicating over the same network as the first device to identify which other devices are currently presenting audio.

Acoustic source localization may also be used to make the determination at diamond 604. For example, input from a microphone array (such as one of the arrays discussed above in reference to the microphone 191) on the first device may be used to perform a time difference of arrival calculation to determine a direction from which the sound came. Then, based on known locations for other devices within the environment in which the first device is disposed and identification of the current location of the first device (e.g., as identified based on input from the first device's GPS transceiver), the first device may determine which other device is in the direction of the sound relative to the current location of the first device to thereby determine which of the other devices is the source of the sound. From there, the first device may determine whether the other device that is the source of the sound is the same device being observed by the user.

An affirmative determination may cause the logic to proceed to decision diamond 606. At diamond 606 the first device may determine whether the audio from the observed device/content—the sound indicated from the microphone input—meets a first sound criterion such as being intelligible to the first device. Whether the audio is intelligible may be based on whether the first device can convert words in the audio to text using speech-to-text software. If words from the audio can be converted to text, the audio may be determined to be intelligible, whereas if the words cannot be converted to text the audio may be determined to be unintelligible.

Whether the audio is intelligible may also be based on whether the first device can identify a song or other sound from the audio. For songs, the song may be identified based on the input from the microphone using music and/or sound identification software such as the Google application or Shazam application. Similarly, the audio itself may be identified as being associated with particular content, and then the first device may determine whether that particular content (e.g., a movie or television show) is the same content being presented on the device being observed by the user. Other sound identification software may also be used to determine if the audio is intelligible, such as software to identify particular sounds within the audio such as birds chirping, rain falling on the ground, or other non-verbal sounds that might be identifiable. If something from the audio or the audio itself can be identified using one of these methods, the audio may be determined to be intelligible. If not, the audio may be determined to be unintelligible.

A negative determination at diamond 606 may cause the logic to proceed to block 610, which will be described shortly. However, first note that an affirmative determination at diamond 606 may cause the logic to proceed to decision diamond 608. At diamond 608 the first device may determine whether the audio indicated from the microphone input meets a second sound criterion such as being above a first threshold volume level (e.g., a threshold decibel level and/or a user-defined optimal volume level). A decibel meter application and/or sound measurement application executing at the first device may be used to make the determination at diamond 606 based on the input from the microphone. The second sound criterion itself may be established by a manufacturer of the first device and/or by a user based on user input as will be discussed further below.

A negative determination at diamond 608 may cause the logic to proceed to block 610. At block 610 the first device may provide a command to the other device that is presenting the observed audio to increase the volume of the observed audio being output by the other device. The command may be a command for the audio to be increased incrementally from a first increment to a next-highest increment, in which case the logic may proceed to block 612 where the logic may revert back to block 600 or 602 and proceed therefrom to then determine whether the volume increase results in the second sound criterion being met, such as bringing the volume of the audio to or above the first threshold volume level, or whether volume should be increased by another increment.

The command may also be a command for the audio to increase by a particular amount (e.g., more than one increment) based on a volume increase the first device determines will result in the second sound criterion being met, such as bringing the volume of the observed audio up to the first threshold level as sensed at the location of the first device. For instance, if the first device determines that the current volume level at the location of the first device is half of the first threshold volume level, the command may be a command to double the volume of the observed audio as output by the other device. Under this example the logic may also continue from block 610 to block 612 to proceed therefrom.

Referring back to decision diamond 608, note that an affirmative determination at diamond 608 may cause the logic to proceed to block 614 rather than to block 610. At block 614 the first device may set/command audio output by the other device to be at a user-defined optimal volume level (which, in some examples, may be the same level as the first threshold volume level). This may be done by the first device by determining a volume level of the observed audio at the location of the first device and then determining how many volume increments the observed audio may be increased or decreased by in order to reach the user-defined optimal level at the location of the first device. From block 614 the logic may proceed to block 612 and then continue therefrom.

Still in reference to FIG. 6 but referring back to decision diamond 604, if a negative determination is made instead of an affirmative one, the logic may proceed from diamond 604 to decision diamond 616. At diamond 616 the first device may determine whether the audio from the observed device/content meets a third sound criterion, such as being intelligible despite sound other than the audio being present as determined based on the microphone input. For example, whether the audio is intelligible may be based on one or more of the methods disclosed above in reference to diamond 606.

A negative determination at diamond 616 may cause the logic to proceed to block 620, which will be described shortly. However, first note that an affirmative determination at diamond 616 may cause the logic to proceed to decision diamond 618. At diamond 618 the first device may determine whether the sound other than the audio from the observed content/device meets a fourth sound criterion, such as being is above a second threshold volume level (e.g., a threshold decibel level and/or an user-defined maximum sound volume level). A decibel meter application and/or sound measurement application executing at the first device may be used to make the determination at diamond 618 based on the input from the microphone. The second fourth sound criterion itself may be established by a manufacturer of the first device and/or by a user based on user input specifying a user-defined maximum sound level for sound from devices other than the device being observed.

A negative determination at diamond 618 may cause the logic to proceed to block 612 where the logic may revert back to block 600 or 602 and proceed therefrom. However, an affirmative determination at diamond 618 may instead cause the logic to proceed to block 620. At block 620 the first device may provide a command to the other device that is presenting the observed audio to increase the volume of the observed audio. The command may be a command for the audio to be increased incrementally from a first increment to a next-highest increment, a command for the audio to be increased by another predefined amount, a command for the audio to be increased to a user-defined optimal level, and/or a command for the audio to be increased to at or above the first threshold volume level described above.

Also at block 612, in addition to or in lieu of increasing the volume of the observed audio at block 620, the first device may provide a command that decreases the sound from the device that is generating the sound other than the observed audio. If the device generating the sound is an appliance such as a smart oven/stove, a smart dishwasher, a smart microwave, a smart fan, or a smart blender, the command that decreases the sound may be a command to shut off the appliance, a command for the appliance to alter its operation to another state that produces less sound, or a command for the appliance to pause its operation. For example, if the device is a smart dishwasher, the command may be for the dishwasher to wash dishes using a "gentle cycle" instead of a "normal cycle" that produces relatively more sound. If the device generating the sound is a computer or other device presenting its own audio (e.g., that is different from the observed audio), the command that decreases the sound may be a command to disable the function producing the sound, to mute audio output, to pause the audio output, to turn off the other device, or to decrease the volume of the sound that is being output.

From block 620 the logic of FIG. 6 may then proceed to block 622. At block 622 the first device may, when the audio being observed by the user has ceased being presented, provide a command that increases the sound from the other sound-generating device to its previous level. For example, if the device generating the sound is an appliance, the command that increases the sound to its previous level may be a command to turn on the appliance, a command for the appliance to alter its operation back to a previous state that might have been altered block 620, or a command for the appliance to resume its operation. If the device generating the sound is a computer or other device presenting its own audio (e.g., that is different from the observed audio), the command that increases the sound back to its previous level may be a command to enable the function producing the sound, to unmute audio output, to unpause/resuming presenting the audio output, to turn on the other device, or to increase the volume of the sound that is being output back to a level prior to a decrease in volume that might have occurred based on a command provided at block 620. From block 622 to the logic may then continue to block 612 and proceed therefrom.

Figure 7:
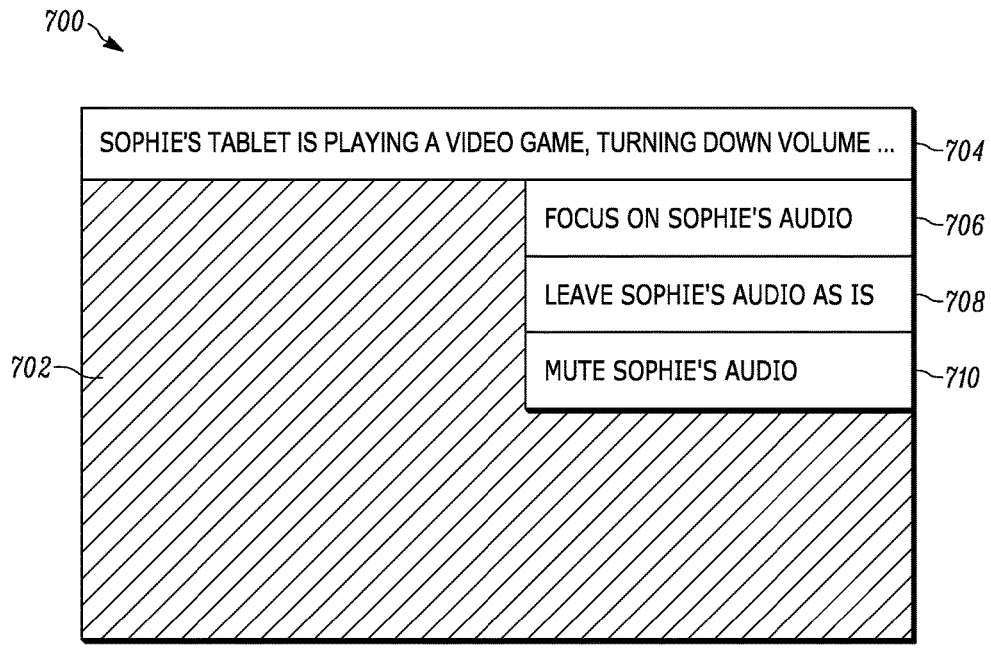
FIGS. 7-9 are example user interfaces (UIs) in accordance with present principles.

Continuing the detailed description in reference to FIG. 7, it shows an example user interface (UI) 700 that may be presented on a user's personal device display, and/or on a display on or otherwise accessible to a device presenting audio that is being observed by a user in accordance with present principles. The UI 700 may include video content 702 associated with audio content that is being presented, such as video content of a television show or movie also having audio content.

The UI 700 may also include an indication 704 that another device has begun generating sound, as might be detected by the user's separate wearable device while being worn by the user or by the user's separate smart phone while on or next to the user. In this example, a tablet computer associated with another person named Sophie is indicated as presenting a video game. This may have been determined by the device presenting the observed content and/or the user's separate personal device based on network communication with Sophie's tablet computer and/or based on identification of the sound from Sophie's tablet computer as being associated with a video game.

The indication 704 may also indicate a command or action being taken by the device presenting the observed content or the user's separate personal device, such as a command that might be provided at block 620 as described above. In this example, the command that is indicated is that the volume on Sophie's tablet computer is being decreased.

The UI 700 may also include one or more selectors 706, 708, 710 that are respectively selectable by a user. By way of example, each selector may be selectable by providing voice input selecting the respective selector, by manipulating a mouse or other cursor movement device to select the respective selector, and/or by providing touch input to a portion of the display presenting the respective selector. The selector 706 may be selectable to command the user's separate personal device (e.g., the device executing the logic of FIG. 6, the user's wearable device that is being worn, and/or the user's smart phone) to "focus" on the audio from Sophie's computer rather than the audio that is associated with the video content 702. In this way, the audio for Sophie's computer may be increased to the user's defined optimal level and/or to a threshold volume level, while the volume of the audio associated with the video content 702 may be decreased.

The selector 708 may be selected to provide a command that audio from Sophie's tablet computer not be increased or decreased and/or that Sophie's tablet computer continue its current operation without alteration. Selector 710 may be selectable to mute the audio coming from Sophie's tablet computer.

Figure 8:
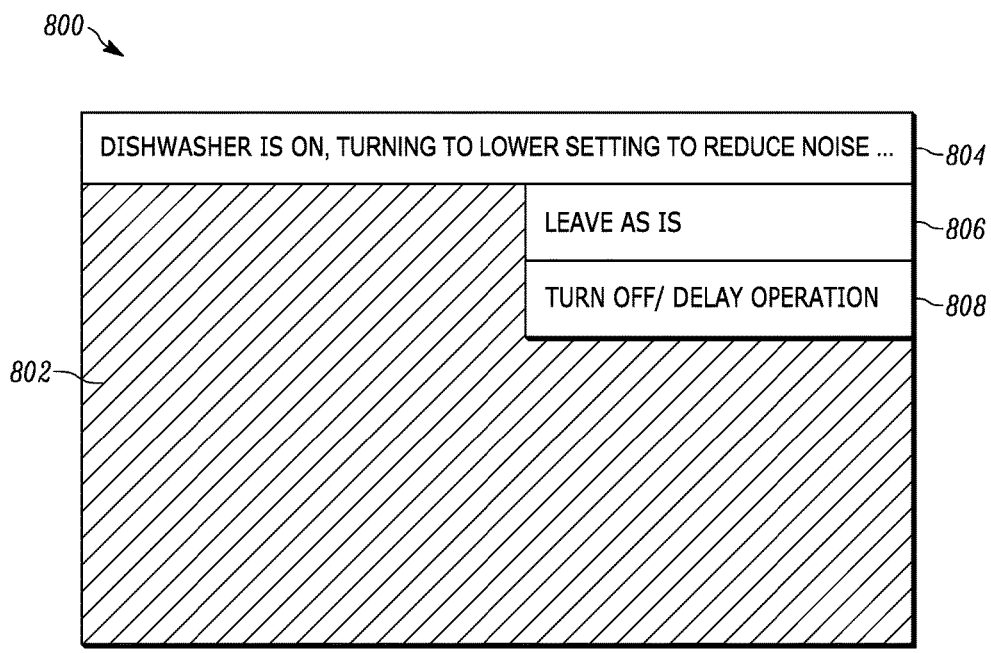

FIG. 8 shows another example UI 800 that may be presented on a user's personal device display, and/or on a display on or otherwise accessible to a device that is presenting audio that is being observed by a user in accordance with present principles. The UI 800 may include video content 802 associated with audio content that is being presented, such as video content of a television show or movie also having audio content.

The UI 800 may also include an indication 804 that a household appliance has begun generating sound, as might be detected by the user's separate wearable device while being worn by the user or by the user's separate smart phone while on or next to the user. In this example, a dishwasher is indicated as being on. This may have been determined by the device presenting the content and/or the user's separate personal device based on network communication with the dishwasher and/or based on identification of the sound from the dishwasher being identified as being associated with operation of the dishwasher.

The indication 804 may also indicate a command or action being taken by the device presenting the content or the user's separate personal device, such as a command that might be provided at block 620 as described above. In this example, the command that is indicated is that the operation of the dishwasher is being altered to reduce the sound coming from the dishwasher.

The UI 800 may also include one or more selectors 806, 808 that are respectively selectable by a user. The selector 806 may be selectable to command the user's separate personal device (e.g., the device executing the logic of FIG. 6, the user's wearable device that is being worn, and/or the user's smart phone) to not provide a command to alter operation of the dishwasher. The selector 808 may be selected to provide a command that the dishwasher should have its operation delayed and/or to provide a command that the dishwasher should be placed in an off state.

Figure 9:
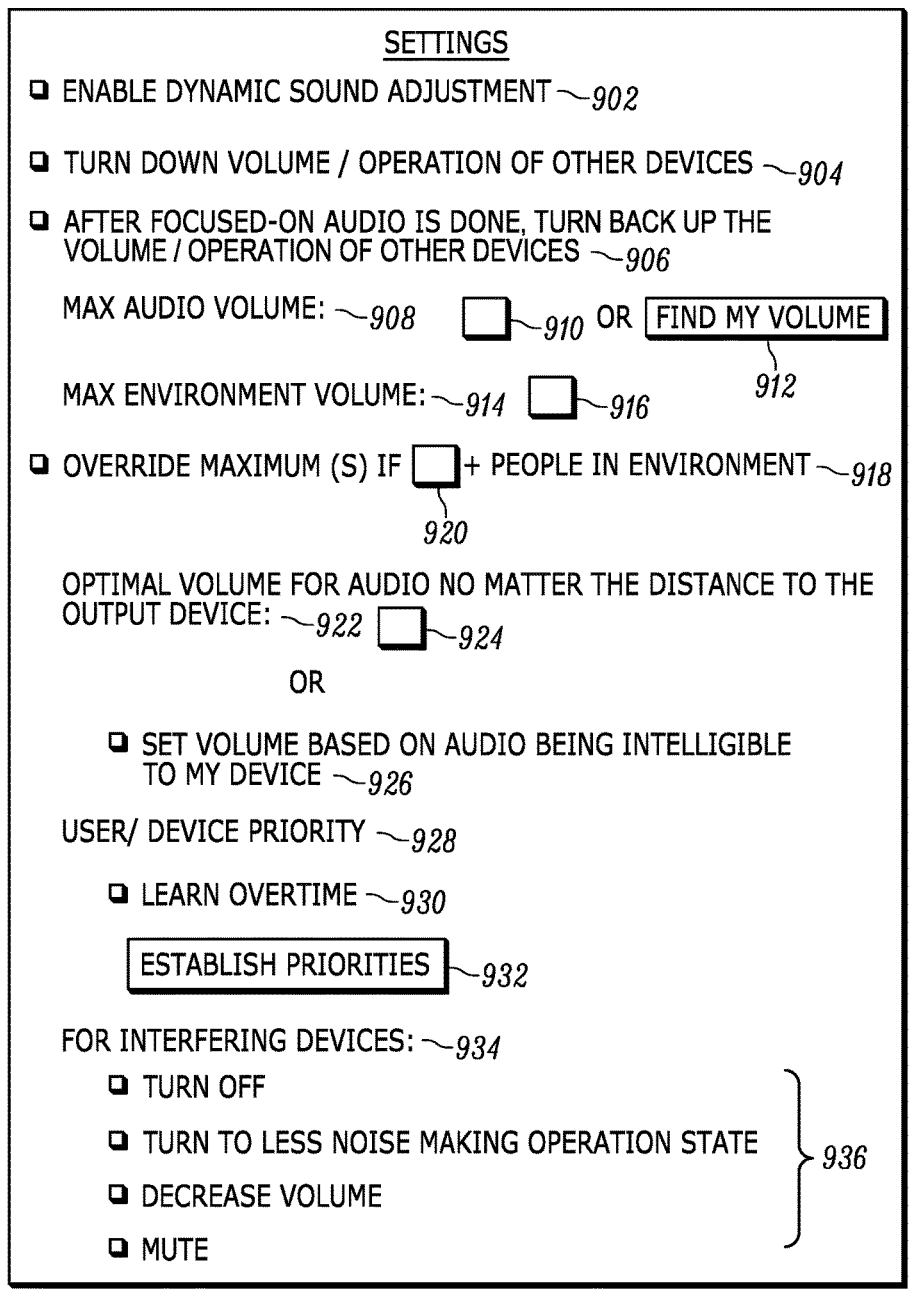

Now describing FIG. 9, it shows an example of a UI 900 that may be presented on a display accessible to a device undertaking present principles, such as the display of a device executing the logic of FIG. 6. The UI 900 may be for configuring settings of the device in accordance with present principles. Each option to be described below may be selected by directing input (e.g., touch input) to the respective check box shown adjacent to the option.

The UI 900 may include a first option 902 that is selectable to enable the device to undertake present principles. For example, option 902 may be selected to configure the device to execute one or more parts, and in some cases, all, of the logic of FIG. 6. The UI 900 may also include a second option 904 that is selectable to configure the device to not only increase the volume of audio being observed by a user but to also decrease the volume of sound produced by other devices not being observed by the user in accordance with present principles. Still further, the UI 900 may include an option 906 that is selectable to configure the device to increase, after decreasing, the volume of sound produced by other devices not being observed by the user in accordance with present principles. For example, option 906 may be selected to enable the device to execute block 622 of FIG. 6.

The UI 900 may also include a setting 908 at which a user may establish a maximum volume to which audio of content being observed may be increased. The maximum volume may be specified by the user by providing input to input box 910 or by selecting selector 912 to initiate a test in which sounds of increasing volume are presented until a user selects one of those volumes as the one to use as the maximum audio volume. In this way, the volume of audio being observed by the user will not increase beyond the user's maximum desired volume even if the user moves farther and farther away from the device presenting the audio. The maximum desired volume may pertain to the volume as sensed as the location of the user or the actual volume output at the observed device itself.

The UI 900 may also include a setting 914 at which a user may establish a maximum volume for all sound from all devices within a given environment (such as the user's personal residence or a particular room within the residence). Thus, this maximum volume setting may pertain not just to audio being observed by the user but to all sound produced together by devices within the environment. Input specifying the maximum volume for this setting may be provided to input box 916.

Additionally, option 918 may be presented on the UI 900. Option 918 may be selected to configure the device to override the volume maximums for one or both of settings 908 and 914 based on a number of people being present in the environment such that sound/audio may be increased beyond the volume maximum(s) if the number of people reaches a certain amount. Input specifying the number of people to use may be directed to input box 920, and the people themselves may be identified by the device based on images from a camera in communication with the device being used identify the number of people using object recognition.

Still in reference to FIG. 9, the UI 900 may also include a setting 922 at which a user may indicate a desired optimal volume level for audio output by an observed device so that volume of the audio may be adjusted to the optimal level at the location of the user even as the user moves closer and farther away from the observed device. Input specifying the optimal level may be provided to input box 924, or through a process similar to that described above in reference to selector 912. Furthermore, as an alternative to using the optimal volume setting, the user may select option 926 to configure the device to adjust volume for the audio based on the audio being intelligible to the device as disclosed herein.

The UI 900 may also include one or more settings pertaining to user-defined priorities. For example, a setting 928 may pertain to which device to focus on above others for enabling a user to hear audio from the focused-on device (e.g., at the user's optimal volume level). An option 930 may be selected to configure the device to learn and establish priorities over time as a user provides commands selecting one device or another as the device on which the user wishes to focus/observe. A selector 932 may also be presented, where selection of the selector 932 may cause the device to present another user interface at which a user may rank various devices connected over the same network from highest to lowest to establish the priority. Priorities may also be established based on users such that audio being observed by some users is prioritized above audio focused on by other users.

The UI 900 may also include a setting 934 pertaining to an action the device is to take to decrease sound produced by other devices that are not being observed by the user but that are still producing sound sensed by the device's microphone. Corresponding options 936 may be presented that are respectively selectable to configure the device to decrease sound from those other devices by turning off the other device, adjusting the other device to a relatively less noise-making operational state, decreasing the volume of audio from the other device, and muting the other device.

Moving on from FIG. 9, it is to be understood in accordance with present principles that in some embodiments, user location alone (rather than microphone input) may be used for adjusting volume up or down. For example, if a user is listening to audio from one device in an environment where no other devices are concurrently producing sound, location data from the user's wearable device (e.g., GPS data) may be used such that as the user moves farther away from the audio device the volume from the audio device may be increased, and as the user moves closer to the audio device the volume from the audio device may be decreased.

Additionally, it is to be understood that a digital assistant may be executed by a device undertaking present principles in order to provide commands to other devices as disclosed herein. For example, the digital assistant may be generally similar to Amazon's Alexa or Apple's Siri.

Before concluding, it is to be understood that although a software application for undertaking present principles may be vended with a device such as the system 100, present principles apply in instances where such an application is downloaded from a server to a device over a network such as the Internet. Furthermore, present principles apply in instances where such an application is included on a computer readable storage medium that is being vended and/or provided, where the computer readable storage medium is not a transitory, propagating signal and/or a signal per se.

It is to be understood that whilst present principals have been described with reference to some example embodiments, these are not intended to be limiting, and that various alternative arrangements may be used to implement the subject matter claimed herein. Components included in one embodiment can be used in other embodiments in any appropriate combination. For example, any of the various components described herein and/or depicted in the Figures may be combined, interchanged or excluded from other embodiments.

What is claimed is:

1. A first device, comprising:
  at least one processor;
  a microphone accessible to the at least one processor; and
  storage accessible to the at least one processor and bearing instructions executable by the at least one processor to:
  receive input from the microphone;
  determine, based on the input from the microphone, whether sound from a second device meets a sound criterion;

responsive to the determination and based on receipt of voice input from a user, issue a command to increase the volume of audio output by a third device.

2. The first device of claim 1, wherein the third device is the same device as the second device, and wherein the instructions are executable by the at least one processor to:
responsive to the determination, issue a command to increase the volume of the audio output by the second device.

3. The first device of claim 2, wherein the instructions are executable by the at least one processor to:
determine that a user is observing the audio output by the second device; and
issue the command based on the determination that the user is observing the audio output by the second device.

4. The first device of claim 1, wherein the third device is different from the second device, and wherein the instructions are executable by the at least one processor to:
responsive to the determination, issue a command to increase the volume of the audio output by the third device.

5. The first device of claim 4, wherein the instructions are executable by the at least one processor to:
determine that a user is observing the audio output by the third device based at least in part on one or more of: a determination of a location in which the first device is disposed, a determination of a location in which the user is disposed; and
issue the command based on the determination that the user is observing the audio output by the third device.

6. A method, comprising:
receiving, at a first device, input from a microphone;
determining, based on the input from the microphone, whether sound from a second device meets a sound criterion;
transmitting, responsive to the determining and based on receiving voice input from a user, a command to a third device to increase the volume: of audio output by the third device.

7. The method of claim 6, wherein the third device is the same device as the second device, and wherein the method comprises:
transmitting, responsive to the determining, a command to the second device to increase the volume of the audio output by the second device.

8. The method of claim 7, wherein the command that is transmitted commands the third device to increase the volume of the audio output by no more than a user-defined volume maximum.

9. The method of claim 6, wherein the third device is different the second device, and wherein the method comprises:
transmitting, responsive to the determining, a command to the third device to increase the volume of the audio output by the third device.

10. The method of claim 6, wherein the third device is different from the second device, and wherein the method comprises:
determining, based on the input from the microphone, that sound from the second device meets the sound criterion;
transmitting, responsive to the determining that sound from the second device meets the sound criterion, a command to the second device that decreases the volume of sound from the second device; and transmitting, responsive to determining that the third device is no longer outputting the audio, a command to the second device that increases the volume of sound from the second device.

11. An apparatus, comprising:
a first processor;
a network adapter; and
storage bearing instructions executable by at least one second processor of a first device for:
receiving input from a microphone accessible to the at least one second processor;
determining, based on the input from the microphone, whether sound from a second device meets a sound criterion;
providing, responsive to the determining and based on receiving voice input from a user, a command to increase the volume of audio output by a third device;
wherein the first processor transfers the instructions to the first device over a network via the network adapter.

12. A first device, comprising:
at least one processor;
a microphone accessible to the at least one processor; and
storage accessible to the at least one processor and bearing instructions executable by the at least one processor to:
receive input from the microphone;
determine, based on the input from the microphone, whether sound from a second device meets a sound criterion;
responsive to the determination, issue a command to alter the volume of audio output by a third device; and
present a graphical user interface (GUI) on a display accessible to the at least one processor, the GUI comprising an on that is selectable to enable a setting, the setting related to increasing volume of audio output by at least one device based on the sound criterion being met.

13. The first device of claim 12, wherein the smart home appliance is a smart kitchen appliance.

14. The first device of claim 1, wherein the voice input received from the user indicates that the user is observing content presented by the third device.

15. The first device of claim 1, wherein the voice input received from the user indicates that the volume of audio output by the third device is to be controlled.

16. The first device of claim 1, wherein the voice input received from the user indicates that the volume of audio output by the third device is to be controlled so that the audio output by the third device is hearable by the user.

17. The first device of claim 1, wherein the instructions are executable by the at least one processor to:
present a graphical user interface (GUI) on a display in communication with the processor, the GUI comprising an option that is selectable to enable a setting, the setting related to increasing volume of audio output by at least one device based on the sound criterion being met.

18. The method of claim 6, wherein the voice input received from the user indicates that the user is observing content presented by the third device.

19. The method of claim 6, wherein the voice input received from the user indicates that the volume of audio output by the third device is to be controlled.

20. The method of claim 6, wherein the voice input received from the user indicates that the volume of audio output by the third device is to be controlled so that the audio output by the third device is hearable by the user.

21. The method of claim 6, comprising:

presenting a graphical user interface (GUI) on a display, the GUI comprising an option that is selectable to enable a setting, the setting related to increasing volume: of audio output by at least one device based on the sound criterion being met.

22. The apparatus of claim 11, wherein the voice input received from the user indicates that the user is observing content presented by the third device.

23. The apparatus of claim 11, where the instructions are executable for:

presenting a graphical user interface (GUI) on a display, the GUI comprising an option that is selectable to enable a setting, the setting related to increasing volume of audio output by at least one device based on the sound criterion being met.

\* \* \* \* \*